(12) United States Patent
Aaltonen et al.

(10) Patent No.: US 6,824,816 B2
(45) Date of Patent: Nov. 30, 2004

(54) PROCESS FOR PRODUCING METAL THIN FILMS BY ALD

(75) Inventors: Titta Aaltonen, Helsinki (FI); Petra Alén, Helsinki (FI); Mikko Ritala, Espoo (FI); Markku Leskelä, Espoo (FI)

(73) Assignee: ASM International N.V. (NL)

( * ) Notice: Subject to any disclaimer, the term of this patent is extended or adjusted under 35 U.S.C. 154(b) by 342 days.

(21) Appl. No.: 10/066,315

(22) Filed: Jan. 29, 2002

(65) Prior Publication Data

US 2003/0165615 A1 Sep. 4, 2003

(51) Int. Cl.$^7$ .............................................. B05D 5/12

(52) U.S. Cl. .................... 427/124; 427/125; 427/126.3; 427/126.5; 427/126.6; 427/130; 427/131; 427/132; 427/250; 427/255.7; 427/331; 427/404; 427/419.2; 427/419.7

(58) Field of Search ................................. 427/124, 125, 427/126.3, 126.5, 126.6, 130, 131, 132, 250, 255.7, 331, 404, 419.2, 419.7

(56) References Cited

U.S. PATENT DOCUMENTS

| | | |
|---|---|---|
| 5,916,365 A | 6/1999 | Sherman |
| 6,342,277 B1 | 1/2002 | Sherman |

OTHER PUBLICATIONS

Fullerton et al., *Solid State Technology*, Sep. 2001 v44 i9 p87.
M. Ritala and M. Leskela, Atomic Layer Deposition, in *Handbook of Thin Film Materials vol. 1: Deposition and Processing of Thin Films*, Ed. H.S. Nalwa, Academic Press, San Diego (2001) Table of Contents (pp. xi–xviii). Chapter 2, p. 103, (no month avail).
Aoyama et al., "Chemical Vapor Deposition of Ru and Its Application in (Ba, Sr) TiO3 Capacitors for Future Dynamic Random Access Memories", *Jpn. J. Appl. Phys.* vol. 38 (1999) Part I No. 43, pp. 2194–2199, (no month avail).

*Primary Examiner*—Bernard Pianalto
(74) *Attorney, Agent, or Firm*—Knobbe Martens, Olson & Bear LLP

(57) ABSTRACT

The invention relates generally to processes for producing electrically conductive noble metal thin films on a substrate by atomic layer deposition. According to one embodiment of the invention a substrate with a surface is provided in a reaction chamber and a vaporised precursor of a noble metal is pulsed into the reaction chamber. By contacting the vaporised precursor with the surface of the substrate, no more than about a molecular layer of the metal precursor is formed on the substrate. In a next step, a pulse of molecular oxygen-containing gas is provided in the reaction chamber, where the oxygen reacts with the precursor on the substrate. Thus, high-quality metal thin films can be deposited by utilising reactions between the metal precursor and oxygen. In one embodiment, electrically conductive layers are deposited in structures that have high aspect ratio vias and trenches, local high elevation areas or other similar surface structures that make the surface rough.

36 Claims, 8 Drawing Sheets

PROCESS FOR PRODUCING METAL THIN FILMS BY ALD

BACKGROUND OF THE INVENTION

1. Field of the Invention

This invention relates generally to methods of manufacturing noble metal (Ru, Rh, Pd, Ag, Re, Os, Ir, Pt) layers, such as for use in integrated circuits (IC) and magnetic recording media.

2. Description of the Related Art

Ruthenium metal is considered to be one of the most promising materials for capacitor electrodes of dynamic random access memories (DRAMs) that have for example $Ta_2O_5$ and/or $(Ba,Sr)TiO_3$ (BST) dielectrics. Ruthenium is also a potential electrode material for nonvolatile ferroelectric memories. Although platinum has been widely used as an electrode material, many disadvantages are connected to that concept, For instance, it is very difficult to pattern platinum layers by etching and platinum catalyzes the dissociation of $O_2$ into atomic oxygen. The formed oxygen thereof diffuses into the underlying barrier, which gets oxidized and forms a resistive layer. On the contrary, ruthenium films can be easily patterned by etching and they prevent oxygen diffusion by forming $RuO_2$, which has good conductivity. Furthermore, because of its large work function, Ru is an interesting electrode material for the future CMOS transistors where $SiO_2$ will be replaced by high-k dielectrics. Though Ru, and for the same reason Ir, are the best candidates in what comes to the oxygen diffusion barrier properties, other noble metals, like Pt and Pd, are still considered as viable candidates for the above applications. With reference to the definition of noble metal, Encyclopedia Britannica states that a noble metal is any of several metallic chemical elements that have outstanding resistance to oxidation, even at high temperatures; the grouping is not strictly defined but usually is considered to include rhenium, ruthenium, rhodium, palladium, silver, osmium, iridium, platinum, and gold; i.e., the metals of groups VIIb, VIII, and Ib of the second and third transition series of the periodic table of elements.

In addition to electrode applications, thin Ru films find potential use in the fixture in magnetic recording technology where the ever-increasing storage densities set increasing demands on both the read and write heads and recording medium (E. E. Fullerton, Solid State Technology, September 2001, p. 87). In anti-ferromagnetically coupled recording medium, for example, a three atomic layer thick Ru film is used for separating two ferromagnetic layers. In a longer term, perpendicular recording systems (magnetization perpendicular to the film plane) are expected to replace the current in-plane or longitudinal media. To create a high performance recording media with the magnetization perpendicular to the film plane, multilayer structures composed of ultra-thin (typically less than 5 atomic layers thick) magnetic and nonmagnetic layers have been suggested. Here Ru and Pd, for example, could be employed as nonmagnetic materials. An evident challenge for these magnetic recording media applications is how to control the film thicknesses at an atomic layer level uniformly over large substrate areas.

The current metallisation technology of integrated circuits is based on electroplated copper. However, a successful electrodeposition process requires an appropriate seed layer on the diffusion barrier material. Typically copper itself, most often deposited by physical vapour deposition methods, is used as a seed layer material. Chemical methods, like chemical vapour deposition and atomic layer deposition, which could provide better step coverage for the copper seed layer, usually suffer from a poor copper to diffusion barrier adhesion. Further, a general problem related to copper seeds is their easy oxidation, which necessitates a reduction step in the beginning of the electrodeposition process. As noble metals do not oxidise easily on their surface, they can serve as good seed layers for copper electrodeposition.

Currently, Ru films are deposited either by sputtering or by chemical vapour deposition (CVD). ALD processes for depositing Ru films have not been reported, although the characteristics of thin films deposited by ALD, especially excellent step coverage (conformality), accurate and simple thickness control and large-area uniformity, are very valuable features in the above mentioned applications.

The main problem in the development work of depositing metals by ALD has been a lack of effective reducing agents, since the metal precursors applicable in ALD are typically compounds, where the metal is at a higher oxidation state (M. Ritala and M. Leskela, Atomic Layer Deposition, in *Handbook of Thin Film Materials*, Ed. H. S. Nalwa, Academic Press, San Diego (2001), Vol. 1, Chapter 2, p. 103). A common strategy has been to look for reducing agents that, besides reducing the metal, remove the ligands of the metal compound intact, most typically in a protonated form. The most simple of such a reaction is the process where hydrogen radicals are used as the reducing agent (A. Sherman, U.S. Pat. No. 5,916,365):

$ML_n(g) \to ML_{n-x}$(chemisorbed), where $x = 0 \ldots n-1$
$ML_{n-x}$(chemisorbed) $+ (n-x)H(g) \to M(s) + (n-x)HL(g)$ Other reducing agents studied for ALD include disilane, diborane, hydrogen, formaldehyde and elemental zinc. In the latter case, zinc removes the halide ligands in the form of volatile zinc halide, e.g. $ZnCl_2$.

Aoyama et al. (Jpn. J. Appl. Phys. 38 (1999) pp. 2194–2199) investigated a CVD process for depositing ruthenium thin films for capacitor electrode purposes. They used bis-(cyclopentadienyl)ruthenium ($Ru(Cp_2)$) as ruthenium precursor and $O_2$ as reactive gas for decomposing $Ru(Cp_2)$ gas. The growth temperature was varied from 230 to 315° C. and the growth rate was 25 nm/min at 315° C. However, carbon and hydrogen were incorporated as harmful impurities in the deposited films, thus increasing the resistivity of the film. Furthermore, the general limitations of the CVD method, such as problems related to achieving good large area uniformity and accurate thickness control, still remain. In addition, it is hard to obtain good step coverage and high film purity at the same time.

SUMMARY OF THE INVENTION

The present invention aims at eliminating the problems of prior art and to provide a novel method of producing metal thin films by ALD.

In particular, it is an object of the present invention to provide processes for producing electrically conductive noble metal thin film on a substrate by atomic layer deposition methods.

It is a third object of the invention to provide methods of producing ultra-high density magnetic recording devices.

These and other objectives, together with the advantages thereof over known processes, which shall become apparent from the following specification, are accomplished by the invention as hereinafter described and claimed.

Now, we have invented novel processes for depositing metal thin films by ALD. In general, the present invention is suitable for depositing noble metal thin films, such as ruthenium, rhodium, palladium, silver, rhenium, osmium, iridium and platinum.

The resulting ALD-grown thin metal films may be utilised, for example, in IC's, e.g. as capacitor electrodes, as gate electrodes and as seed layers for copper metallization, as well as nonmagnetic layers in magnetic media for separating ferromagnetic layers.

In the preferred embodiment of the present invention a vaporised precursor of a noble metal is pulsed into a reaction chamber, where it is contacted with the surface of a substrate placed in the reaction chamber to form a molecular layer of the metal precursor on the substrate. The reaction chamber is purged to remove excess vaporised metal precursor. Surprisingly we have now found that oxygen, in particular oxygen in molecular form, is capable of reducing noble metal compounds into elemental form. High quality metal thin films can be deposited by utilizing reactions between the metal precursor and oxygen. This is surprising, since oxygen is usually considered an oxidising source chemical in ALD and even as such an agent its reactivity is usually only modest at temperatures below 500° C. Clearly, the reduction mechanism described herein differs from the earlier examined ALD metal processes, where the ligands are removed intact. In the processes disclosed herein, oxygen apparently burns the ligands into carbon oxides and water and, surprisingly, reduces the metal instead of forming a metal oxide, even with those metals (like Ru) that are known to have stable oxides. Thus, in the preferred embodiment the substrate comprising the adsorbed noble metal precursor is contacted with a reactant gas that comprises oxygen, preferably free oxygen and more preferably molecular oxygen. For instance, ruthenium and platinum compounds that are chemisorbed on the substrate surface can be reduced into elemental metal by using oxygen, or by providing oxygen into the reaction chamber by decomposing oxygen containing precursors, such as $H_2O_2$, into oxygen inside the reactor. Since ruthenium and platinum are noble metals, it can be concluded that oxygen could transform chemisorbed precursors of other noble metals into elemental form as well. Naturally, for metals that have less positive potential relative to the hydrogen electrode than noble metals such a mechanism cannot be expected, as these metals form more stable oxides than the noble metals.

In one embodiment, electrode layers comprising noble metals are formed in capacitor structures of integrated circuits. In a further embodiment, extremely thin films of noble metals which act as non-magnetic separation layers are used in producing ultra-high density magnetic recording devices.

More specifically, in the preferred embodiment an electrically conductive noble metal thin film on a substrate is produced by placing a substrate in a reaction chamber within a reactor, providing a vaporized noble metal precursor into the reaction chamber to form a single molecular layer of the precursor on the substrate, removing excess vaporized precursor from the reaction chamber providing a second reactant gas comprising oxygen to the reaction chamber such that the oxygen reacts with the precursor on the substrate, removing excess reactant gas and reaction by-products from the reaction chamber; and repeating until a thin film of the desired thickness is obtained.

In one embodiment a capacitor structure is produced by depositing a first insulating layer on a silicon substrate having a doped region, placing a conductive material through the insulating layer to contact the substrate, depositing a barrier layer over the exposed surface of the conductive material, depositing a first electrode layer comprising a noble metal on the barrier layer by an atomic layer deposition process, depositing a second insulating layer on the first electrode layer, and depositing a second electrode layer comprising a noble metal on the second insulator by an atomic layer deposition process.

In another embodiment an ultra-high density magnetic recording device is produced by forming a first ferromagnetic recording layer on a substrate, forming a non-magnetic layer consisting essentially of a noble metal on the first ferromagnetic recording layer by an atomic layer deposition process, and forming a second ferromagnetic recording layer on the non-magnetic layer.

A number of considerable advantages are obtained with the aid of the present invention. The well-known advantageous characteristics of ALD (accurate and simple control of film thickness, excellent step coverage, i.e. conformality, and large area uniformity) can be obtained for deposition of metal thin films. The processes of the present invention provide a method of producing high quality conductive thin films with excellent step coverage. The processes are particularly beneficial for making electrically conductive layers in structures that have high aspect ratio vias and trenches, local high elevation areas or other similar surface structures that make the surface rough. The present vapour phase processes are easily integrated into current process equipment, such as that used for the manufacture of integrated circuits (IC) or magnetic recording media.

The amount of impurities present in the metal films deposited according to the processes of the present invention is low, which is essential when aiming at high conductivity of the film. The amounts of H, C and N impurities are typically in the order of 0.1 to 0.3 at-%. The amount of residual oxygen is typically in the range of 0.3 to 0.5 at-%.

The uniformity of the films and reproducibility of the processes can surprisingly be improved by providing the substrate surface with hydroxyl groups. Such a hydroxyl group rich surface, which promotes nucleation, can be realised very easily by depositing an ultra-thin layer of metal oxide, such as $Al_2O_3$ or $TiO_2$. In one embodiment the layer of metal oxide is deposited by ALD by using $H_2O$ and/or $H_2O_2$ as an oxygen source.

DETAILED DESCRIPTION OF THE PREFERRED EMBODIMENT

Figure 1:
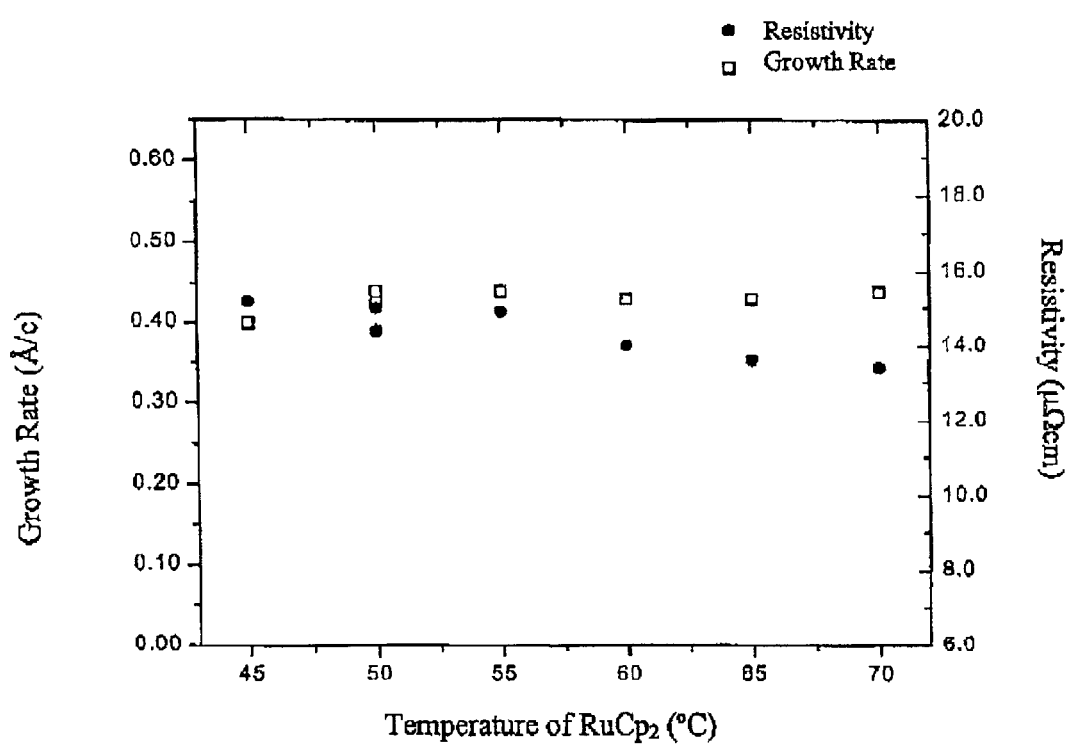
FIG. 1 shows the growth rate and resistivity of ruthenium thin films as a function of the evaporation temperature of the ruthenium precursor.

The present invention relates generally to methods of producing thin films by atomic layer deposition (ALD) processes. According to typical ALD methods a substrate with a surface is placed in a reaction chamber, the substrate is heated up to suitable deposition temperature at lowered pressure, a first reactant is conducted in the form of gas phase pulses (in the following also: "gaseous reactant is pulsed") into the reaction chamber and contacted with the surface of the substrate to bind or adsorb no more than about one monolayer of the reactant onto the surface, excess of the first reactant is purged out of the reaction chamber in vaporous or gas form, a second gaseous reactant is pulsed onto the substrate to provide a surface reaction between the second reactant and the first reactant bound to the surface, excess of the second reactant and gaseous by-products of the surface reactions are purged out of the reaction chamber, and the steps of pulsing and purging are repeated in the indicated order until the desired thickness of the depositing thin film is reached. The method is based on controlled surface reactions of the precursor chemicals. Gas phase reactions are avoided by feeding reactants alternately into the reaction chamber. Vapour phase reactants are separated from each other in the reaction chamber by removing excess reactants and/or reactant by-products from the reaction chamber, such as with an evacuation step and/or with an inactive gas pulse (e.g. nitrogen or argon).

According to the preferred embodiment, a noble metal thin film is produced on a substrate surface by a process comprising at least the following steps:

providing a substrate with a surface into a reaction chamber, pulsing a vaporised precursor of the noble metal into the reaction chamber to form a molecular layer of the metal precursor on the substrate, purging the reaction chamber to remove excess vaporised noble metal precursor, providing a pulse of oxygen containing gas onto the substrate, purging the reaction chamber to remove excess of the oxygen containing gas and the gaseous by-products formed in the reaction between the metal precursor layer on the substrate and the oxygen, and repeating the pulsing and purging steps until desired thickness of the depositing thin film is reached.

According to another embodiment of the present invention the final metal structure may consist of two or more different noble metal layers on top of each other. For example, the growth can be started with the deposition of platinum and ended with the deposition of ruthenium metal.

The substrate can be of various types of material. When manufacturing integrated circuits, the substrate preferably consists of numerous thin films with varying chemical and physical properties. The surface of the substrate may be a dielectric layer, such as $Ta_2O_5$ or $(Ba,Sr)TiO_3$. Further, the substrate surface may have been patterned and it therefore consists of small (less than 1 μm) nodes, vias and/or trenches with a very high aspect ratio, approximately from 2:1 up to 150:1 and even higher.

Thus, in the preferred process for producing a capacitor structure in integrated circuits, the noble metal layer is preferably deposited on a barrier layer comprising, for example, a metal nitride. In one embodiment that process comprises providing a silicon substrate having a doped region, which forms the active part of a transistor;

depositing a first insulator layer on the substrate;

placing a conductor material in contact with the silicon substrate so that it extends through the insulator layer forming an exposed surface;

depositing a barrier layer essentially covering the exposed surface of the conductor material;

depositing by atomic layer deposition a first electrode layer comprising a noble metal on the barrier layer;

depositing a second insulator layer on the first electrode layer; and depositing by atomic layer deposition a second electrode layer comprising a noble metal on the second insulator.

The substrate layer may also comprise a ferromagnetic layer, as in the production of an ultra-high density magnetic recording device, wherein a first and a second ferromagnetic recording layer are formed on a substrate, the second being spaced apart from the first, and a separation layer comprising a nonmagnetic layer of a noble metal is preferably deposited by ALD between the first and the second ferromagnetic layers.

The noble metal precursor employed in the ALD processes may be solid, liquid or gaseous material, provided that the metal precursor is in vapour phase or is evaporated before it is conducted into the reaction chamber and contacted with the substrate surface to bind the precursor onto the substrate. Pulsing a vaporised precursor onto the substrate means that the precursor vapour is conducted into the chamber for a limited period of time. Typically, the pulsing time is from about 0.05 to 10 seconds. However, depending on the substrate type and its surface area, the pulsing time may be even higher than 10 seconds.

In the methods of the present invention, suitable metal precursors for depositing conductive noble metal layers are generally metal compounds where the metal is bound or coordinated to either oxygen or carbon, and more preferably metallocene compounds and beta-diketonate compounds of the metals. When depositing ruthenium thin films, preferred metal precursors are bis(cyclopentadienyl)ruthenium and tris(2,2,6,6-tetramethyl-3,5-heptanedionato)ruthenium(III) and their derivatives, such as bis(pentamethylcyclopentadienyl)ruthenium and bis(2,2,6,6-tetramethyl-3,5-heptanedionato)(1,5-cyclooctadiene)ruthenium(II). When depositing platinum films, preferred metal precursors are (trimethyl)methylcyclopentadienylplatinum(IV), platinum (II) acetylacetonato, bis(2,2,6,6-tetramethyl-3,5-heptanedionato)platinum(II) and their derivatives.

Purging the reaction chamber means that gaseous precursors and/or gaseous byproducts formed in the reaction between the precursors are removed from the reaction chamber, such as by evacuating the chamber with a vacuum pump and/or by replacing the gas inside the reactor with an inert gas (purging), such as argon or nitrogen. Typical purging times are from about 0.05 to 20 seconds.

The oxygen containing pulse can be provided by pulsing oxygen or a mixture of oxygen and another gas into the reaction chamber, or by forming oxygen inside the reactor by decomposing oxygen containing chemicals, such as $H_2O_2$, $N_2O$ and/or an organic peroxide. For example, the catalytical formation of an oxygen containing pulse can be provided by introducing into the reactor a pulse of vaporised aqueous solution of $H_2O_2$ and conducting the pulse over a catalytic surface inside the reactor and thereafter into the reaction chamber. For instance, the catalytic surface may preferably be a piece of platinum or palladium.

The oxygen pulse is preferably a free-oxygen containing gas pulse, more preferably a molecular oxygen-containing gas pulse and can therefore consist of a mixture of oxygen and inactive gas, for example, nitrogen or argon. Preferred oxygen content of the oxygen-containing gas is from about 10 to 25%. Therefore, one preferred source of oxygen is air. In the case of relatively small substrates (e.g., up to 4-inch wafers) the mass flow rate of the oxygen-containing gas is preferably between about 1 and 25 sccm, more preferably between about 1 and 8 sccm. In case of larger substrates the mass flow rate of oxygen-containing gas is scaled up.

The pressure in the reaction space is typically between about 0.01 and 20 mbar, more preferably between 1 and 10 mbar.

Before starting the deposition of the film, the substrate is typically heated up to a suitable growth temperature. Preferably, the growth temperature of metal thin film is approximately from about 200 to 500° C., more preferably from about 300 to 360° C. for Ru, and from about 250 to 400° C. for Pt.

The processing time depends on the thickness of the layer to be produced and the growth rate of the film. In ALD, the growth rate of a thin film is determined as thickness increase per one cycle. One cycle consists of the pulsing and purging steps of the precursors and the duration of one cycle is typically between about 0.2 and 30 seconds, Examples of suitable arrangements of reactors used for the deposition of thin films according to the processes of the present invention are, for instance, commercially available ALD equipment, such as the F-120 and Pulsar™ reactors, produced by ASM Microchemistry Ltd. In addition to these ALD reactors, many other kinds of reactors capable for ALD growth of thin films, including CVD reactors equipped with appropriate equipment and means for pulsing the precursors, can be employed for carrying out the processes of the present invention. The growth processes can optionally be carried out in a cluster tool, where the substrate arrives from a previous process step, the metal film is produced on the substrate, and then the substrate is transported to the following process step. In a cluster tool, the temperature of the reaction space can be kept constant, which clearly improves the throughput compared to a reactor in which is the substrate is heated up to the process temperature before each run.

A stand-alone reactor can be equipped with a load-lock. In that case, it is not necessary to cool down the reaction space between each run.

In one embodiment the present invention provides processes for the deposition of capacitor electrodes. A silicon substrate 30 is provided, with a doped region 34 that is an active part of a transistor. Field oxide 32 separates the transistors from each other. An insulator layer 36, e,g., $SiO_2$, is grown on the substrate. The insulator is planarized. A resist layer 38 is formed on the insulator layer 36 and patterned so that an opening 40 is formed. Vias are etched to the insulator and the via is filled with a conductor material 50, e.g. polysilicon. Polysilicon layer is patterned and etched so that the via plug and a tooth-like extension over the plug remain on the structure. The polysilicon tooth minimizes the amount of expensive metal that is needed for the lower electrode. Exposed surface of the polysilicon may be very rough after the etching step so that the surface area of polysilicon is as large as possible. A barrier layer 52, e.g. tantalum silicon nitride $Ta_xSi_yN_z$ is deposited over the substrate by e.g. Atomic Layer Deposition (ALD). The barrier layer is patterned and etched so that there is barrier layer left only on and near the polysilicon surface.

A noble metal, e.g. Pt or Ru, is grown by ALD on the substrate and then the metal layer is patterned and etched so that there is metal 54 left only on and near the barrier layer 52. After that a capacitor insulator 56 is deposited on the substrate. The capacitor insulator 56 preferably has a high dielectric constant, i.e. it is a high-k material. A high-k material preferably has a k value $\geq 5$, more preferably $\geq 10$, even more preferably $\geq 20$. Barium-strontium titanate (BST) and tantalum oxide $Ta_2O_5$ serve as examples of suitable high-k materials. The high-k layer is optionally annealed to increase the crystallinity and dielectric constant of the layer. Finally, an upper electrode 58, e.g. Ru or Pt is deposited on the high-k material 56, and patterned and etched so that the capacitor can be addressed (electrically accessed).

Another way of constructing the capacitor is to planarize the substrate surface after the deposition of polysilicon and then form a metal knob on polysilicon. However, a relatively thick layer of metal is needed on the polysilicon plug to increase the effective area of the capacitor. In that case the metal, e.g. Pt or Ru deposited by ALD, forms the part of the "tooth" that extends above the insulator 36 plane.

Figure 5:
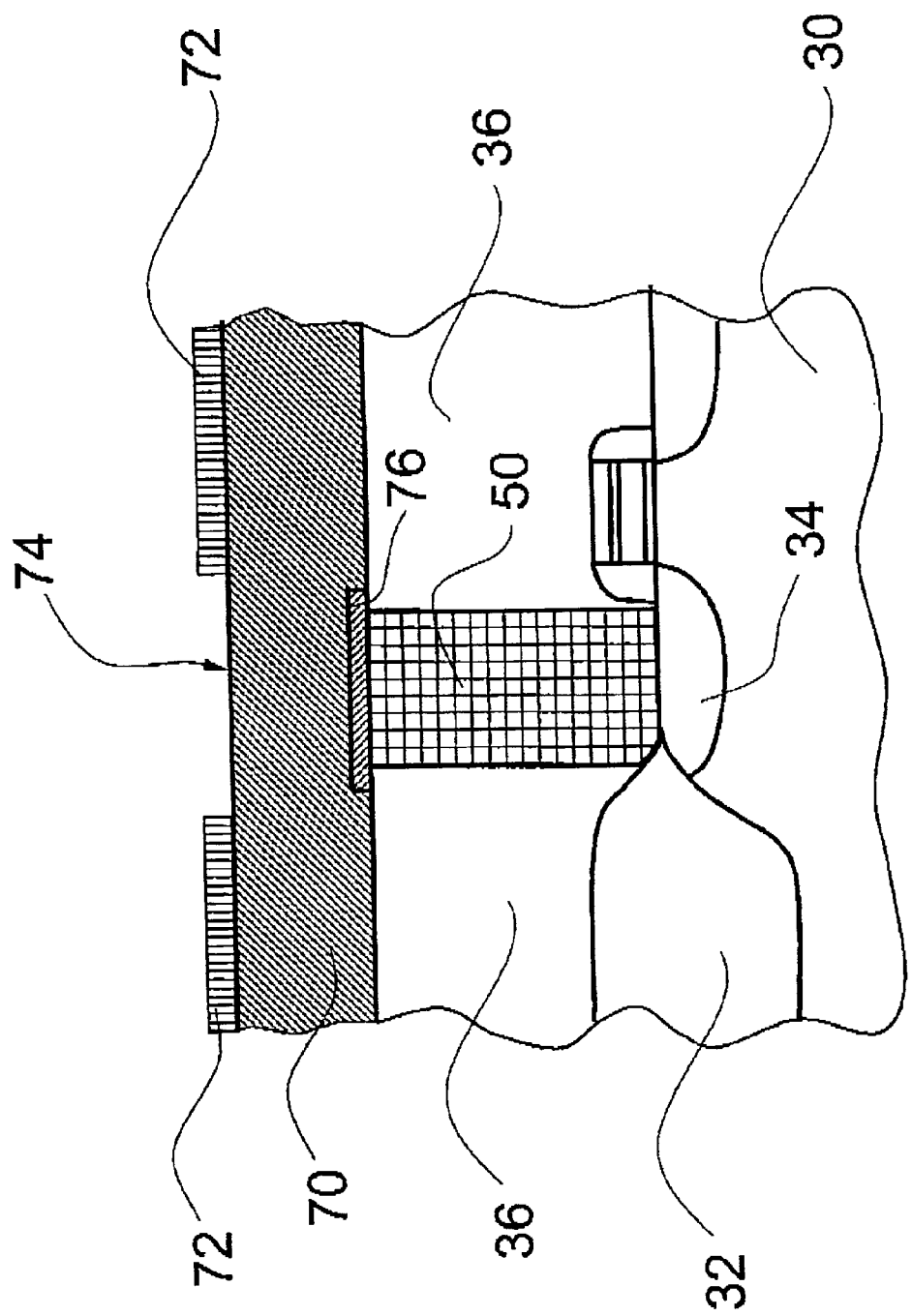
FIG. 5 is a schematic side view of the structure of a DRAM capacitor before the formation of a capacitor hollow.
Figure 6:
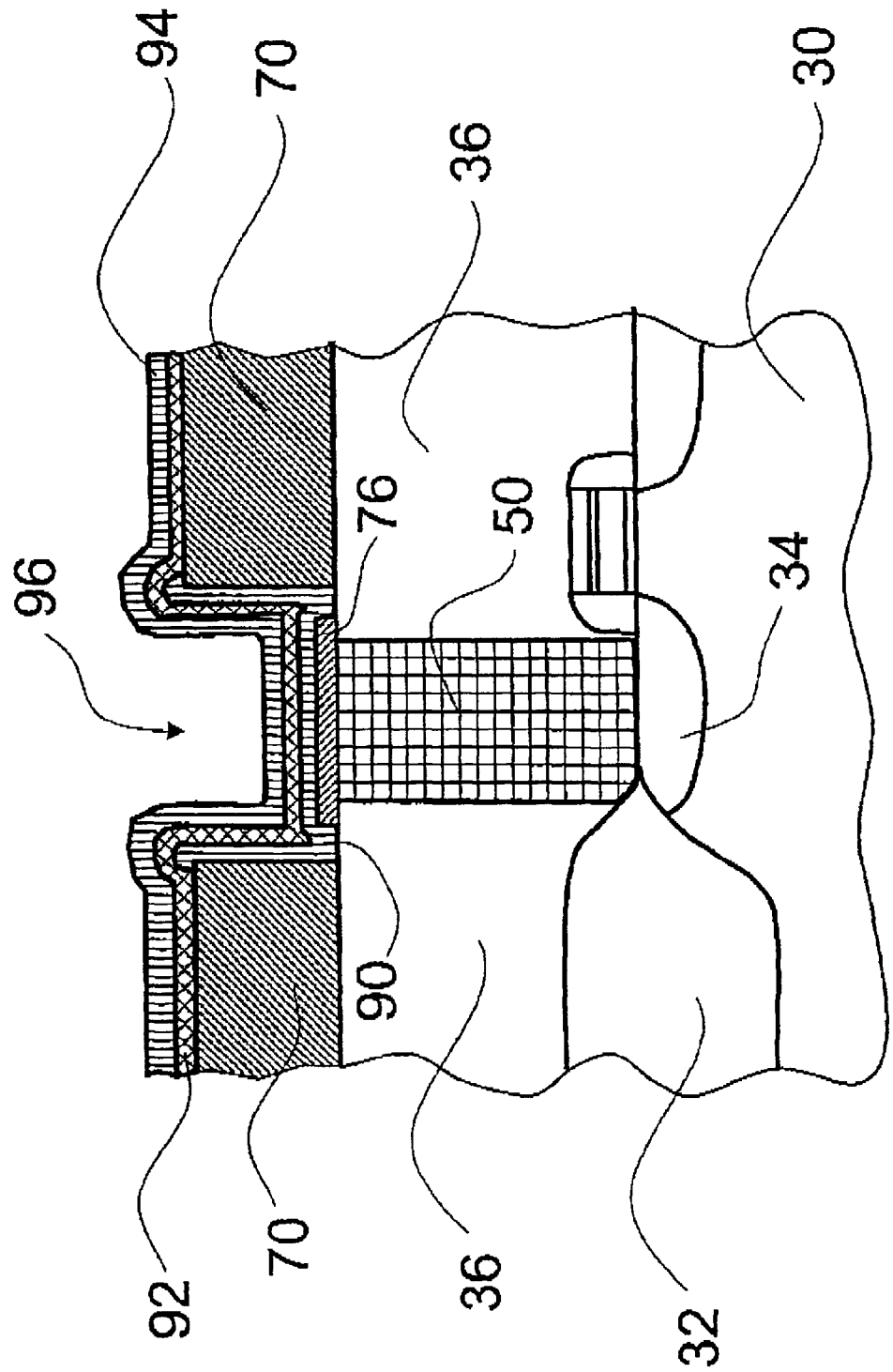
FIG. 6 is a schematic side view of the structure of a DRAM capacitor after the formation of a capacitor hollow and the deposition of capacitor thin films.

Another way of increasing the effective area of the capacitor is to etch a hollow on a surface and form a capacitor structure on the walls and the bottom of the hollow. As shown in FIG. 5, there is a polysilicon plug 50 extending through the first insulator layer 36. The second insulator layer 70 (e.g. $SiO_2$) is deposited on the first insulator layer and polysilicon plug. A resist 72 placed on the surface of the second insulator 70 is patterned so that an opening 74 can be formed over the polysilicon plug 50. Referring to FIG. 6, the second insulator is etched until a capacitor hollow 96 is formed. Residual resist is removed. Then a barrier layer, e.g. $Ta_xSi_yN_z$ is deposited on the substrate and patterned so that only the top surface of the polysilicon plug is covered with the barrier 76. A lower metal electrode, e.g. Pt or Ru, is deposited by ALD on the substrate and patterned and etched so that only the bottom and the walls of the hollow are covered with the lower metal electrode 90. High-k dielectric layer 92, e.g. BST is grown on the substrate by e.g. ALD. An optional annealing step may be used to increase the crystallinity and dielectric constant of the dielectric layer 92. Finally, the upper metal electrode 94, e.g., Pt or Ru, is deposited by ALD on the high-k thin film 92 according to the present invention.

Figure 7:
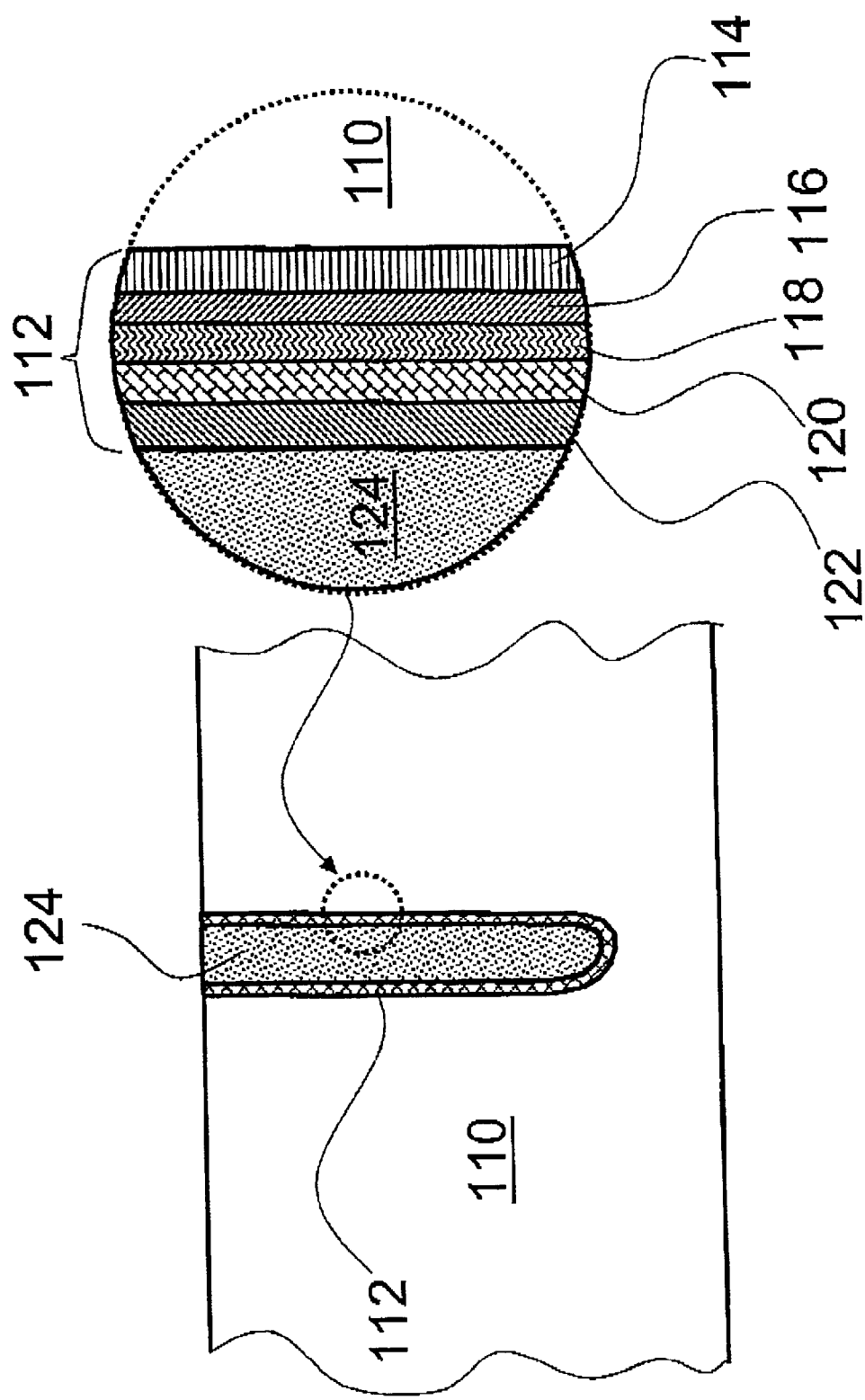
FIG. 7 is a schematic side view of the structure of a DRAM trench capacitor.
Figure 8:
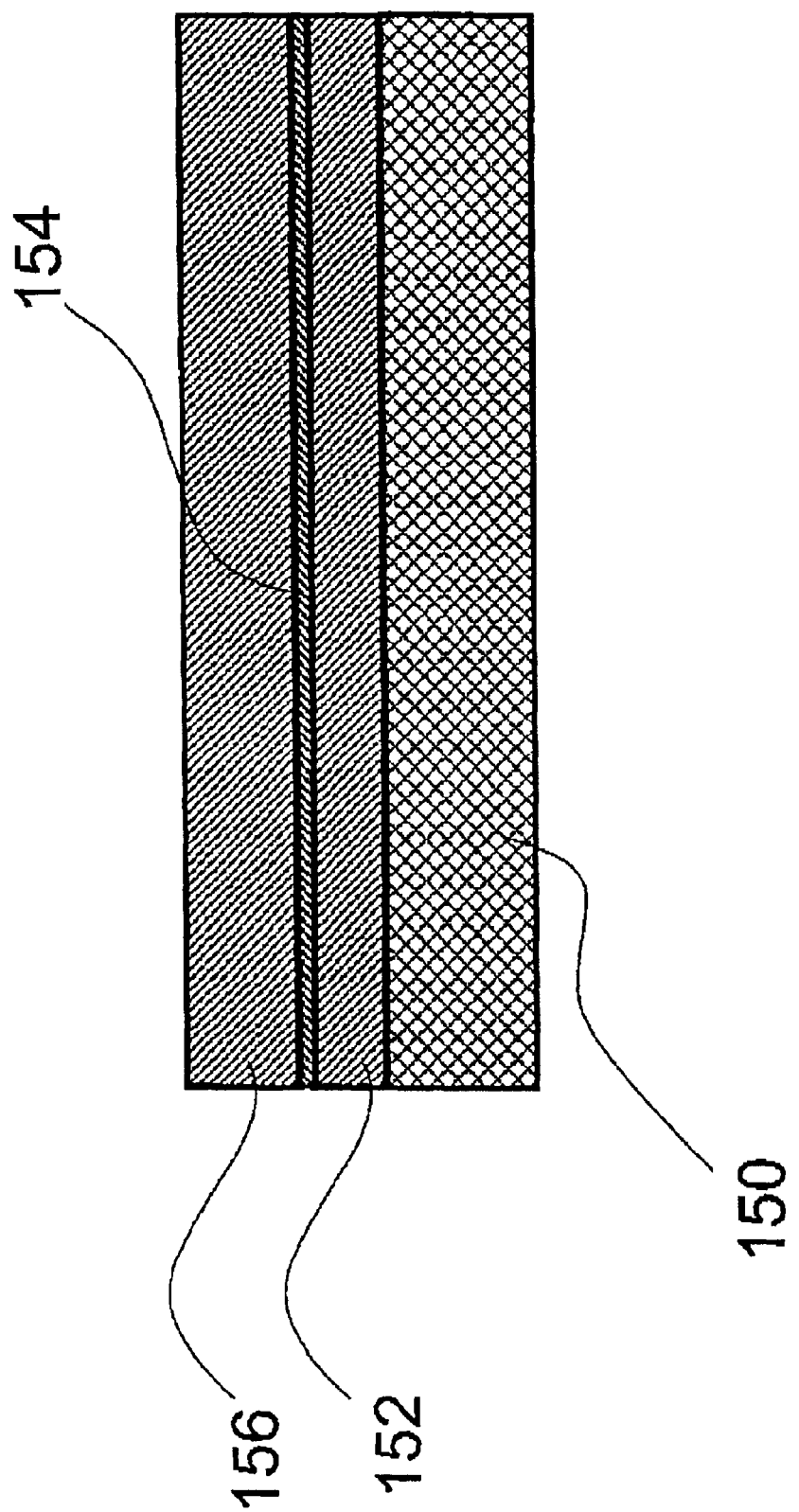
FIG. 8 is a schematic side view of magnetic recording plate that shows the position of a non-magnetic separator film.

Still another way of increasing the effective area of the DRAM capacitor while keeping the reserved substrate area to a minimum is to place the capacitor structure in a deep pit etched on silicon substrate. The structure is called a trench capacitor. FIG. 7 shows a trench capacitor without the addressing lines and semiconducting active components. On silicon substrate 110 there is a trench with a surface that has been covered with a multi-layer thin film 112. The deposition has started with the formation of a barrier layer 114, e.g. $Ta_xSi_yN_z$, which is preferably formed between the silicon and platinum group metals or ruthenium to prevent the formation of metal silicides. On the barrier layer 114 a first metal electrode 116, e.g. Pt or Ru, is grown according to the present invention by ALD. On the first metal electrode layer 116 a high-k layer 118, e.g. BST, is grown e.g. by ALD. On the high-k layer 118 a second metal electrode layer 120, e.g. Pt or Ru, is grown according to the present invention by ALD. In the case where the trench will be filled with polysilicon 124, it is preferable to protect the second metal electrode 120 with a barrier thin film 122, e.g. $Ta_xSi_yN_z$.

The thickness of the metal electrode can be selected from approximately 1 nm up to about 200 nm and even more depending on the application.

Optionally, the deposition process can be enhanced by initiating the growth by providing the substrate surface with hydroxyl groups. In one embodiment a thin initiating layer of a metal oxide, such as $Al_2O_3$ or $TiO_2$, is deposited before starting the growth of the metal film. Fragments of ammonia attached to the surface, i.e. —$NH_2$ and =NH groups, may also serve as nucleation points for the metal deposition. A layer of 10 Å to 20 Å of the oxide is capable of providing the desired improvement in the metal deposition process, i.e. the reproducibility of the process and the uniformity of the films is improved. If the metal deposition 58 is preceded by a dielectric deposition, such as $(Ba,Sr)TiO_3$ 56 in the case of DRAMS or $ZrO_2$ or $HfO_2$ in the case of CMOS transistors, and that process leaves the dielectric surface covered with hydroxyl groups, no separate hydroxylation step is required. Examples of such dielectric deposition processes are all water based ALD oxide processes. Further, a hydroxyl-group deficient surface can be re-hydroxylated with reactive compounds, such as hydrogen peroxide ($H_2O_2$). This is advantageous, for example, in cases where it is not possible to grow an insulating layer prior to the deposition of the metals of the present invention.

In the case of ultrahigh density magnetic recording it is advantageous to divide the ferromagnetic recording layer on a substrate 150 with a nonmagnetic layer 154, e.g. Ru, into two parts 152 and 156 in the thickwise direction. As a result, the stability of the magnetic polarization state of very small magnetic bits on the surface is enhanced and spontaneous random flipping of the magnetic polarization state is avoided. Ru film 154 that helps to form antiferromagnetically coupled media is deposited according to the present invention.

According to still another embodiment of the present invention, a seed layer is deposited and utilized in dual damascene structures for the copper metallization of vias and trenches. In this embodiment a substrate with trenches and vias coated with a diffusion barrier is provided into the reaction chamber. The seed layer consisting of at least one metal selected from Ru, Rh, Pd, Ag, Re, Os, Ir and Pt is grown from alternating vapor phase pulses of a metal source chemical and an oxygen source chemical that are separated from each other with an evacuation step and/or an inactive gas (e.g. nitrogen or argon) pulse, as described above. The thickness of the resulting seed layer can be from approximately 1 nm up to 30 nm or even more depending on the dimensions of the trenches and vias. The seed layer is useful, for example, as a starting layer for the copper deposition by electroplating or a CVD process.

The following non-limiting examples will illustrate the invention in more detail.

EXAMPLE 1

Ruthenium thin films were deposited in a flow type F-120™ ALD reactor (ASM Microchemistry). Bis(cyclopentadienyl)ruthenium $(Ru(Cp)_2)$ and air (with a flow rate of 8 sccm during the pulses) were used as precursors. The ruthenium films were deposited on 5×5 cm² borosilicate glass substrates covered by thin $Al_2O_3$ film. The growth temperature was 350° C.

The $Al_2O_3$ film was found to be beneficial to obtain uniform ruthenium films and a reproducible process. The inventors assume that this is due to a high density of reactive sites, such as hydroxyl groups (—OH), on an $Al_2O_3$ film. The density of such reactive sites is high on a fresh surface of an $Al_2O_3$ thin film that is deposited by ALD. In this experiment the thin $Al_2O_3$ film for initiating proper growth of Ru films was produced by ALD by using $AlCl_3$ and $H_2O$ or $H_2O_2$ as precursors. Total amount of 40 cycles of $Al_2O_3$ was applied.

The effect of the dose of ruthenium precursor was varied by varying the evaporation temperature. Therefore the temperature of the open evaporation boat inside the reactor was varied form 45 to 70° C. The growth rate and the quality of the films were investigated.

The pulse length of evaporated ruthenium precursor was 0.5 seconds and the purge thereafter was 0.5 seconds. The pulse length of air pulse was 0.2 seconds and the purge thereafter was 0.5 seconds. The total amount of cycles was 3000. The results in FIG. 1 show that the deposition rate is independent of the $RuCp_2$ dose as varied through its vapour pressure, which in turn is varied through its evaporation temperature. This proves that the film growth proceeds in a self-limiting manner as is characteristic of ALD. Therefore, all the advantageous features of ALD are available.

EXAMPLE 2

Ruthenium thin films were deposited in a flow type F-120 ALD reactor (ASM Microchemistry). Bis(cyclopentadienyl)ruthenium $(Ru(Cp)_2)$ and air (with a flow rate of 8 sccm during the pulses) were used as precursors. $Ru(Cp)_2$ was evaporated from an open boat inside the reactor at 50° C. The ruthenium films were deposited on 5×5 cm² borosilicate glass substrates covered by thin $Al_2O_3$ film. The growth temperature was 350° C.

The effect of the dose of ruthenium precursor was varied by varying the pulse length of the evaporated precursor from 0.2 seconds to 1.2 seconds. The growth rate and the quality of the films were investigated.

The purge after the ruthenium pulse was 0.5 seconds. The pulse length of air pulse was 0.2 seconds and the purge thereafter was 0.5 seconds. The total amount of cycles was 3000.

The results in Table 1 show that the deposition rate is independent of the $RuCp_2$ dose as varied through its pulse length, when the pulse time is longer than 0.2 s. This proves that the film growth proceeds in a self-limiting manner as is characteristic of ALD.

TABLE 1

Effect of the length of the $RuCp_2$-pulse

| Length of $RuCp_2$-pulse | Resistivity ($\mu\Omega$cm) | Growth rate (Å/cycle) | Thickness (Å) |
| --- | --- | --- | --- |
| 0.2 s | 17.9 | 0.20 | 400 |
| 0.5 s | 14.4 | 0.43 | 860 |
| 0.5 s | 15.0 | 0.44 | 870 |
| 0.7 s | 14.9 | 0.47 | 940 |
| 1.0 s | 14.1 | 0.47 | 940 |
| 1.2 s | 13.9 | 0.48 | 960 |

EXAMPLE 3

Ruthenium thin films were deposited in a flow type F-120 ALD reactor (ASM Microchemistry). Bis(cyclopentadienyl)ruthenium (Ru(Cp)z) and air were used as precursors. $Ru(Cp)_2$ was evaporated from an open boat inside the reactor at 50° C. The ruthenium films were deposited on 5 cm×5 cm borosilicate glass substrates covered by thin $Al_2O_3$ film. The tested growth temperature was 350° C.

The pulse length of evaporated ruthenium precursor was 0.5 seconds and the purge thereafter was 0.5 seconds. The pulse length of air pulse was 0.2 seconds and the purge thereafter was 0.5 seconds. The total amount of cycles was 2000.

The effect of the dose of oxygen was tested by varying the air flow rate from 0 to 14 sccm. The growth rate and the quality of the films were investigated. The results in Table 2 show that the deposition rate is independent of the air flow above 4 sccm. This proves that the film growth proceeds in a self-limiting manner as characteristic to ALD. Further, as the film growth does not proceed without air, it is proved that the growth is not due to a decomposition of $RuCp_2$ but due to a reaction between $RuCp_2$ and oxygen.

TABLE 2

Effect of air flow rate

| Air flow rate | Resistivity ($\mu\Omega$cm) | Growth rate (Å/cycle) | Thickness (Å) |
| --- | --- | --- | --- |
| 14 sccm | 12.1 | 0.35 | 700 |
| 8 sccm | 15.0 | 0.44 | 870 |
| 8 sccm | 14.4 | 0.43 | 860 |
| 4 sccm | 14.4 | 0.43 | 860 |
| 2 sccm | 12.3 | 0.34 | 680 |
| 1 sccm | 12.4 | 0.31 | 610 |
| 0 sccm | — | — | No film |

EXAMPLE 4

Ruthenium thin films were deposited in a flow type F-120™ ALD reactor (ASM Microchemistry). Bis(cyclopentadienyl)ruthenium $(Ru(Cp)_2)$ and air (with a flow rate of 1 sccm during the pulses) were used as precursors. $Ru(Cp)_2$ was evaporated from an open boat inside the reactor at 50° C. The ruthenium films were deposited on 5×5 $cm^2$ borosilicate glass substrates covered by thin $Al_2O_3$ film. The tested growth temperature was 350° C.

The pulse length of evaporated ruthenium precursor was 0.5 seconds and the duration of the purge thereafter was 0.5 seconds. The pulse length of air pulse was varied and the purge thereafter was 0.5 seconds. The total amount of cycles was 2000.

The effect of the dose of oxygen was tested by varying the length of the air pulse from 0.2 to 2.0 seconds. The flow rate of oxygen was 1 sccm. The growth rate and the quality of the films were investigated. The results in Table 3 show that the deposition rate is independent of the air pulse length above one second. This proves that the film growth proceeds in a self-limiting manner as characteristic to ALD.

TABLE 3

Effect of air pulse length

| Air pulse length | Resistivity ($\mu\Omega$cm) | Growth rate (Å/cycle) | Thickness (Å) |
| --- | --- | --- | --- |
| 0.2 s | 12.4 | 0.31 | 610 |
| 0.5 s | 13.1 | 0.32 | 640 |
| 0.7 s | 12.4 | 0.38 | 760 |
| 1.0 s | 12.4 | 0.39 | 780 |
| 1.0 s | 12.5 | 0.43 | 860 |
| 1.5 s | 12.0 | 0.44 | 880 |
| 2.0 s | 11.7 | 0.45 | 890 |

EXAMPLE 5

Ruthenium thin films were deposited in a flow type F-120 ALD reactor (ASM Microchemistry). Bis(cyclopentadienyl)ruthenium $(Ru(Cp)_2)$ and air (with a flow rate of 8 sccm during the pulses) were used as precursors. $Ru(Cp)_2$ was evaporated from an open boat inside the reactor at 50° C. The ruthenium films were deposited on 5 cm×5 cm borosilicate glass substrates covered by thin $Al_2O_3$ film. The tested growth temperature was 350° C.

The pulse length of evaporated ruthenium precursor was 0.5 seconds and the duration of the purge thereafter was 0.5 seconds. The pulse length of air pulse was 0.2 seconds and the purge thereafter was varied. The total amount of cycles was 2000.

The effect of the length of the purge after the air pulse was tested by varying the length of the purge from 0.2 to 1.0 seconds. The growth rate and the quality of the films were investigated. Results in Table 4 show that there is no dependence on the purge time, thus proving that the precursor pulses are well separated.

TABLE 4

Effect of the length of the purge after the air pulse

| Length of air purge | Resistivity ($\mu\Omega \cdot$cm) | Growth rate (Å/cycle) | Thickness (Å) |
| --- | --- | --- | --- |
| 0.2 s | 12.1 | 0.41 | 810 |
| 0.5 s | 14.4 | 0.43 | 860 |
| 0.5 s | 15.0 | 0.44 | 870 |
| 1.0 s | 13.1 | 0.40 | 800 |

EXAMPLE 6

Ruthenium thin films were deposited in a flow type F-120 ALD reactor (ASM Microchemistry). Bis(cyclopentadienyl)ruthenium $(Ru(Cp)_2)$ and air (with a flow rate of 8 sccm during the pulses) were used as precursors. $Ru(Cp)_2$ was evaporated from an open boat inside the reactor at 50° C. The ruthenium films were deposited on 5 cm×5 cm borosilicate glass substrates covered by thin $Al_2O_3$ film. Again, the $Al_2O_3$ film was found to be beneficial in obtaining smooth and reproducible ruthenium films. The tested growth temperature was 350° C.

The pulse length of evaporated ruthenium precursor was 0.5 seconds and the duration of the purge thereafter was varied. The pulse length of air pulse was 0.2 seconds and the purge thereafter was 0.5 seconds. The total amount of cycles was 2000.

The effect of the length of the purge after the $Ru(Cp)_2$ pulse was tested by varying the length of the purge from 0.2 to 1.0 seconds. The growth rate and the quality of the films were investigated. Results in Table 5 show that there is no dependence on the purge time, thus proving that the precursor pulses are well separated.

TABLE 5

Effect of the length of the purge after the $RuCp_2$ pulse

| Length of purge after Ru(Cp)2 | Resistivity ($\mu\Omega$cm) | Growth rate (Å/cycle) | Thickness (Å) |
| --- | --- | --- | --- |
| 0.2 s | 13.3 | 0.40 | 790 |
| 0.5 s | 14.4 | 0.43 | 860 |
| 0.5 s | 15.0 | 0.44 | 870 |
| 1.0 s | 12.9 | 0.38 | 750 |

EXAMPLE 7

Ruthenium thin films were deposited in a flow type F-120™ ALD reactor (ASM Microchemistry). Bis (cyclopentadienyl)ruthenium (Ru(Cp)$_2$) and air (with a flow rate of 8 sccm during the pulses) were used as precursors. Ru(Cp)$_2$ was evaporated from an open boat inside reactor at 50° C. The ruthenium films were deposited on 5×5 cm$^2$ borosilicate glass substrates covered by thin Al$_2$O$_3$ film. The tested growth temperatures were 350 and 300° C.

The effect of the number of total amount of cycles was tested. The growth rate and the quality of the films were investigated.

Table 6 and 7 show that as characteristic to ALD, film thicknesses can be controlled simply but accurately by the number of deposition cycles applied. Some initiation period with lower growth rate seems to exist in the beginning of the film growth, however. This can be attributed to the initial nucleation on the oxide surface.

TABLE 6

Effect of number of cycles at the growth temperature of 350° C.

| Number of cycles | Resistivity ($\mu\Omega \cdot cm$) | Growth rate (Å/cycle) | Thickness (Å) |
|---|---|---|---|
| 1000 | 17.5 | 0.39 | 390 |
| 1000 | 15.1 | 0.35 | 350 |
| 2000 | 14.4 | 0.43 | 860 |
| 2000 | 15.0 | 0.44 | 870 |
| 3000 | 12.9 | 0.41 | 1240 |
| 3000 | 13.3 | 0.39 | 1170 |
| 4000 | 11.7 | 0.41 | 1620 |
| 4000 | 12.6 | 0.44 | 1740 |

TABLE 7

Effect of number of cycles at the growth temperature of 300° C.

| Number of cycles | Resistivity ($\mu\Omega cm$) | Growth rate (Å/cycle) | Thickness (Å) | Comments |
|---|---|---|---|---|
| 1000 | 257 | 0.09 | 90 | thin, non-uniform film, poor conductivity |
| 2000 | 19.0 | 0.18 | 350 | Uniform film with metallic luster |
| 3000 | 14.7 | 0.27 | 810 | Uniform film with metallic luster |
| 4000 | 12.5 | 0.29 | 1150 | Uniform film with metallic luster |

EXAMPLE 8

Ruthenium thin films were deposited in a flow type F-120 ALD reactor (ASM Microchemistry). Bis(cyclopentadienyl) ruthenium (Ru(Cp)$_2$) and air (with a flow rate of 8 sccm during the pulses) were used as precursors. Ru(Cp)$_2$ was evaporated from an open boat inside the reactor at 50° C. The ruthenium films were deposited on 5 cm×5 cm borosilicate glass substrates covered by thin Al$_2$O$_3$ film. Again, the Al$_2$O$_3$ film was found to be beneficial to obtain uniform ruthenium films and a reproducible process. As deposited TiO$_2$ was found to have such a beneficial effect too.

In this experiment the thin Al$_2$O$_3$ film for promoting nucleation and thereby initiating proper growth of Ru films was produced by ALD by using AlCl$_3$ and H$_2$O or H$_2$O$_2$ as precursors. Total amount of 40 cycles of Al$_2$O$_3$ was applied on the surface of the substrate before starting the deposition of the Ru film.

Figure 2:
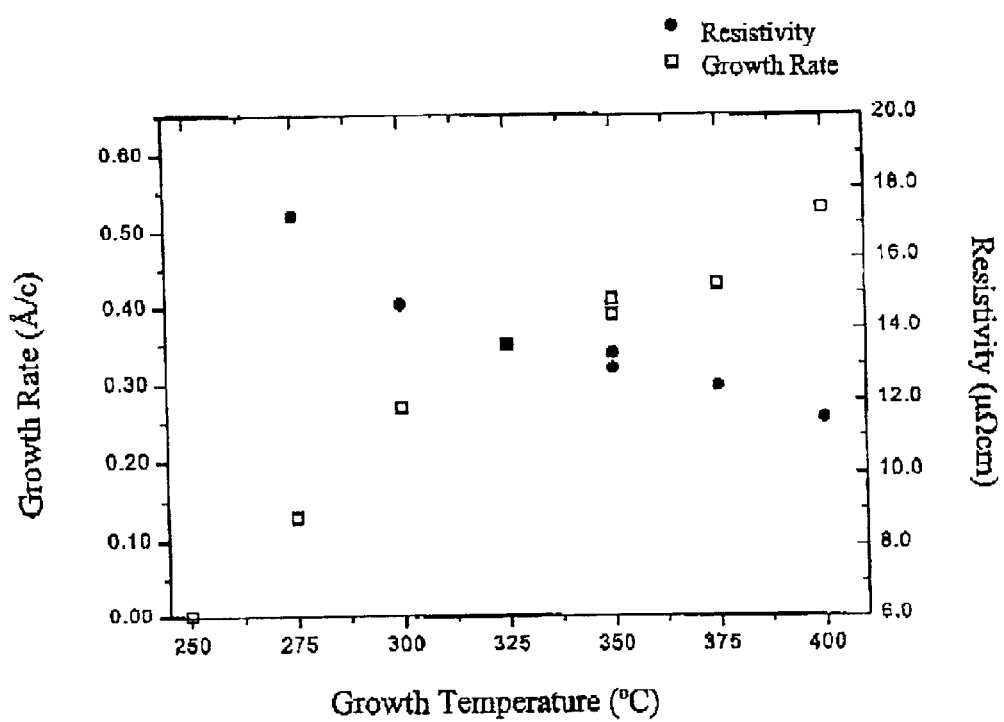
FIG. 2 shows the growth rate and resistivity of ruthenium thin films as a function of the growth temperature.
Figure 3:
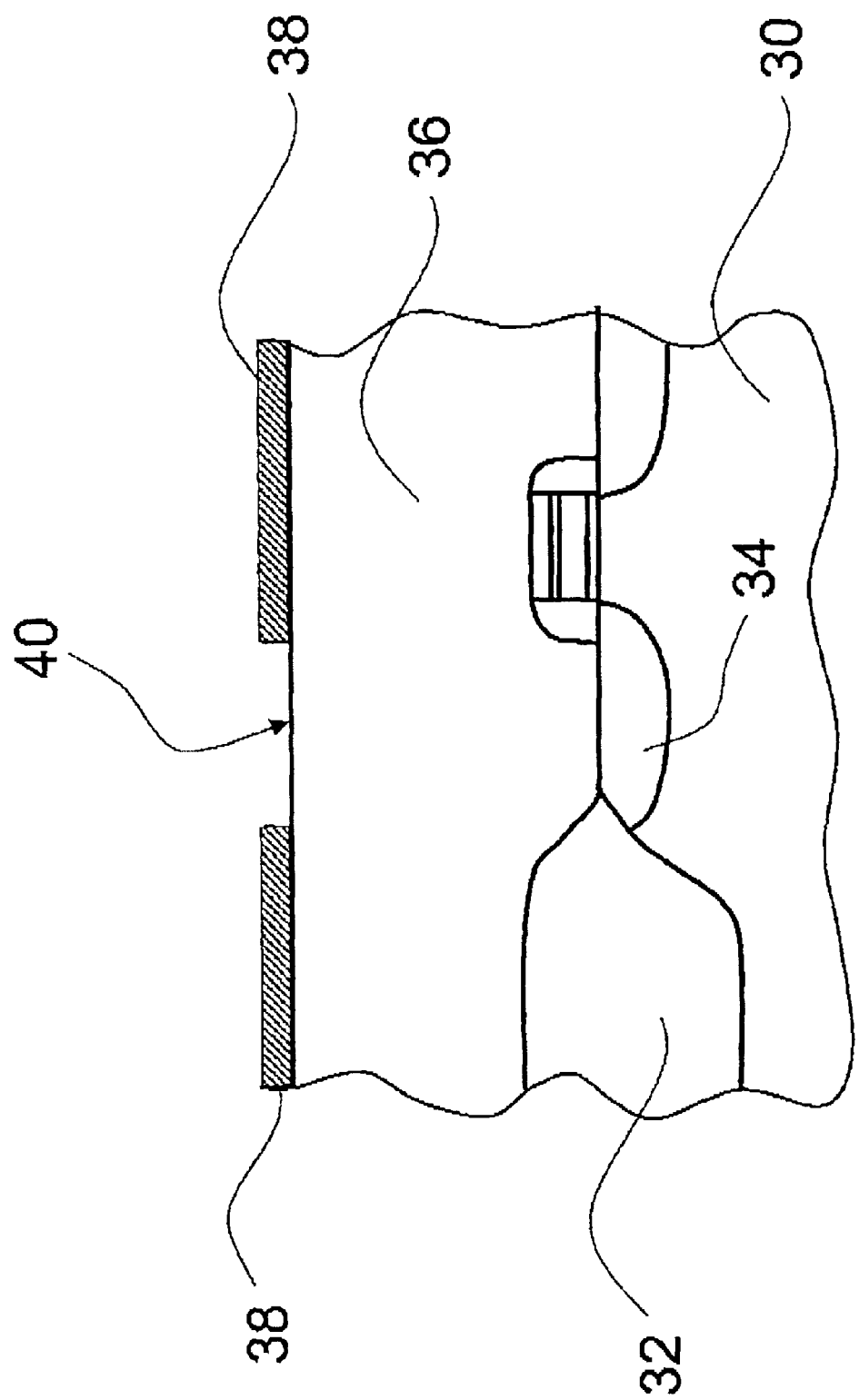
FIG. 3 is a schematic side view of the structure of a DRAM capacitor before the formation of a conductor peg.
Figure 4:
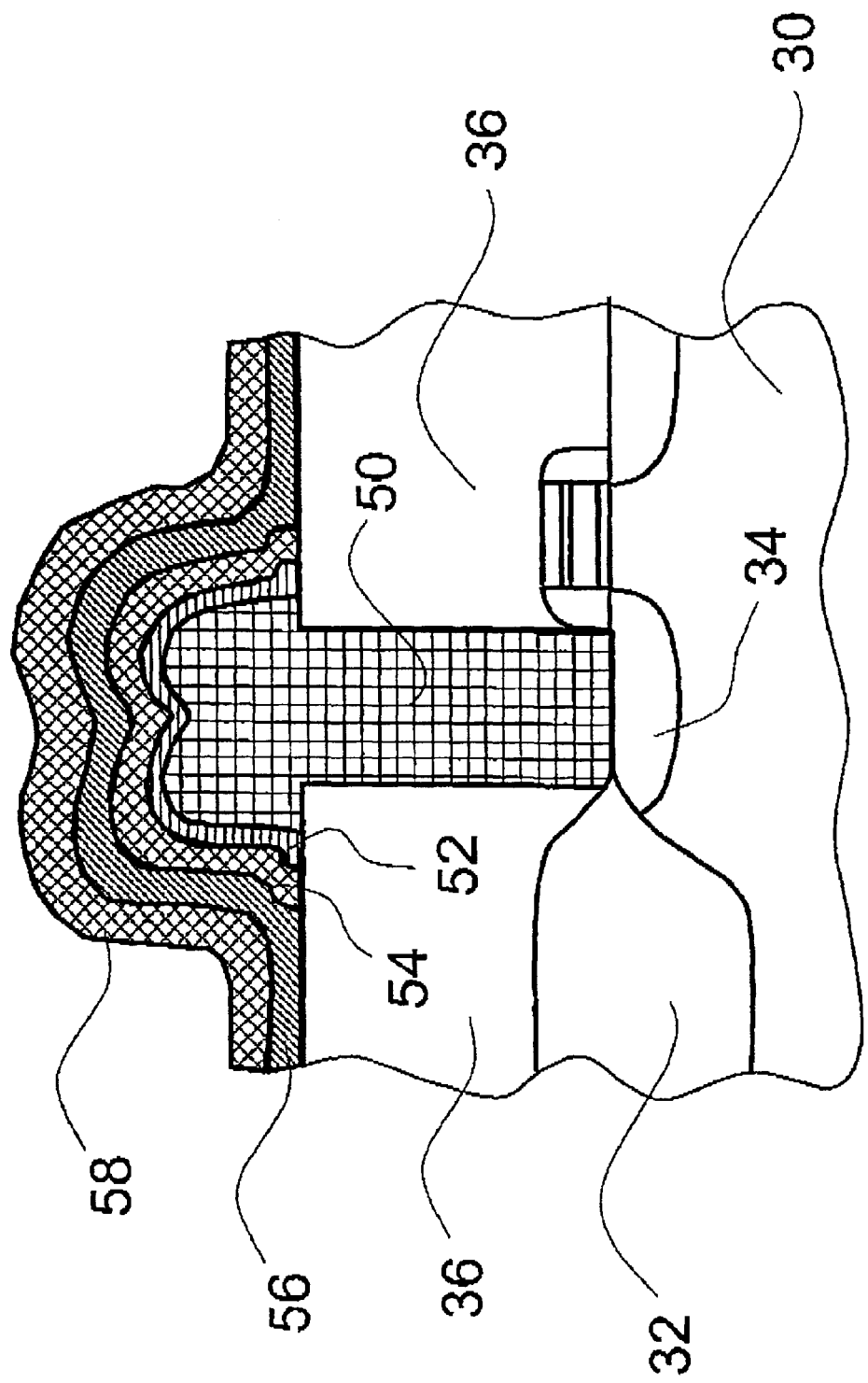
FIG. 4 is a schematic side view of the structure of a DRAM capacitor after the formation of a conductor peg and the deposition of capacitor thin films.

The effect of deposition temperature on the growth and the quality of the films was tested. Growth temperatures from 250 to 450° C. were tested as shown in FIG. 2. The content of ruthenium, oxygen, carbon, nitrogen and hydrogen of the films grown at 300, 350° C. and 400° C. were measured by time-of-flight elastic recoil detection analysis (TOF-ERDA) and the results are shown in Table 8.

The pulse length of evaporated ruthenium precursor was 0.5 seconds and the purge thereafter was 0.5 seconds. The pulse length of air pulse was 0.2 seconds and the purge thereafter was 0.5 seconds. The total amount of cycles was 3,000. The results shown in Table 1 show that Ru films with low resistivities are obtained over a broad temperature range of 275° C.–400° C. From the growth rate and film purity point of view it is beneficial to use deposition temperatures from 350° C. to 400° C. However, already at 300° C. the film purity is remarkable.

TABLE 8

Composition of the ruthenium thin films by TOF-ERDA

| Growth temperature (° C.) | Ru at % | O at % | C at % | N at % | H at % |
|---|---|---|---|---|---|
| 400 | ~100 | <0.5 | <0.3 | <0.1 | <0.2 |
| 350 | ~100 | <0.4 | <0.2 | <0.1 | <0.2. |
| 300 | ~100 | <1.5 | <0.3 | <0.1 | <0.4 |

EXAMPLE 9

Ruthenium thin films were deposited in a flow type F-120 ALD reactor (ASM Microchemistry). Bis(cyclopentadienyl) ruthenium (ruthenocene, Ru(Cp)$_2$) and 30% hydrogen peroxide solution were used as precursors. Ru(Cp)$_2$ was evaporated from an open boat inside the reactor at 75° C. Hydrogen peroxide solution was kept at room temperature and was introduced into the reactor through needle and solenoid valves. The ruthenium films were deposited on 5 cm×5 cm borosilicate glass substrates covered by a thin Al$_2$O$_3$ film. The Al$_2$O$_3$ film was found to be beneficial to obtain uniform ruthenium films and a reproducible process.

The deposition of ruthenium films was carried out according to the ALD method by pulsing Ru(Cp)$_2$ and H$_2$O$_2$ alternately into the reactor. H$_2$O$_2$ was pulsed over a platinum plate to decompose H$_2$O$_2$ to O$_2$. The pulse length of Ru(Cp)$_2$ was varied between 0.2 and 1.0 s and the pulse length of H$_2$O$_2$ was varied between 0.5 and 2.0 s. The length of the purge pulse was always 0.5 s after the Ru(Cp)$_2$ pulse and 1.5 s after the H$_2$O$_2$ pulse.

The films were grown at 350° C. The deposition rate varied between 0.41 and 0.44 Å/cycle when the Ru(Cp)$_2$ pulse length was varied between 0.2 and 1.0 s and the pulse length of H$_2$O$_2$ was 2.0 s. When the pulse length of Ru(Cp)$_2$ was kept constant (0.5 s) and the pulse length of H$_2$O$_2$ was varied between 0.5 and 2.0 s and the deposition rate increased from 0.35 to 0.44 Å/cycle, respectively. According to the XRD measurements the films were polycrystalline ruthenium metal. The resistivity of the films varied between 10 and 15 $\mu\Omega$cm. The resistivity was measured by the four-point probe method.

EXAMPLE 10

Deposition experiments of ruthenium thin films were carried out in a flow type F-120 ALD reactor (ASM Microchemistry). Bis(2,2,6,6-tetramethyl-3,5-heptanedionato) ruthenium(II) (Ru(thd)$_2$) and air with a flow rate of 25 sccm during the pulses were used as precursors.

Ru(thd)$_2$ was evaporated from an open boat inside the reactor at 100° C. The ruthenium films were deposited on 5×5 cm$^2$ borosilicate glass substrates covered by thin Al$_2$O$_3$ film. The deposition temperature was either 350 or 400° C. and the growth rates were 0.40 and 0.35 Å/cycle, respectively. These growth rates are comparable to those obtained with Ru(Cp)$_2$. The resistivities were 17–18 µΩcm. According to the XRD measurements the films were polycrystalline ruthenium metal.

EXAMPLE 11

Deposition experiments of ruthenium thin films were carried out in a flow type F-120 ALD reactor (ASM Microchemistry). Bis(2,2,6,6-tetramethyl-3,5-heptanedionato) ruthenium(II) (Ru(thd)$_2$) and 30% hydrogen peroxide water solution were used as precursors. Ru(thd)$_2$ was evaporated from an open boat inside the reactor at 120° C. Hydrogen peroxide solution was kept at room temperature and was introduced into the reactor through needle and solenoid valves. The ruthenium films were deposited on 5×5 cm$^2$ borosilicate glass substrates covered by thin Al$_2$O$_3$ film. The deposition temperature was varied between 400 and 500° C. The films had lower growth rate than those deposited from Ru(Cp)$_2$. According to the XRD measurements the films were polycrystalline ruthenium metal.

EXAMPLE 12

Platinum thin films were deposited in a flow type F-120 ALD reactor (ASM Microchemistry). (Trimethyl) methylcyclopentadienylplatinum (PtTMCp) and air (with a flow rate of 25 sccm during the pulses) were used as precursors. PtTMCp was evaporated from an open boat inside the reactor at 21° C. The platinum films were deposited on 5×5 cm$^2$ borosilicate glass substrates covered by thin Al$_2$O$_3$ film. The growth temperature was 300° C. Furthermore, it was tested that Pt film grows at 250° C., too.

The pulse length of platinum precursor was 0.5 seconds and the purge after the platinum precursor pulse was 1.0 seconds. The pulse length of air pulse was varied front 0.5 to 2.0 seconds and the purge thereafter was 2.0 seconds. The total number of cycles was 1500.

It was found out that platinum films barely grew when the air pulse length was 0.5 seconds. However, the air pulse of only 1.0 second resulted in uniform film growth at the rate of 0.35 Å/cycle. The resistivities of the films were measured. The results are shown in Table 9.

TABLE 9

The effect of air pulse length on the resistivities and growth rates of platinum thin films.

| Length of air pulse (s) | Resistivity (µΩcm) | Growth rate (Å/cycle) | Thickness (nm) |
| --- | --- | --- | --- |
| 1.0 | 13.9 | 0.35 | 52 |
| 1.5 | 12.4 | 0.43 | 65 |
| 2.0 | 12.6 | 0.45 | 68 |

The variation of the film thickness over the substrate was negligible. The thickness variation over 4 cm was within the range of the accuracy of the applied measurement method, i.e. ±1 nm.

EXAMPLE 13

Platinum thin films were deposited as described in Example 12 at 300° C. The pulse length of platinum precursor was 0.5 seconds followed by a purge of 1.0 second. The pulse length of air pulse was 1.0 second and the purge thereafter was 2.0 seconds. The effect of the total number of cycles on the growth rate was tested with 1500, 2250 and 3000 cycles.

The resistivities and thicknesses of the films were measured. The results are shown in Table 10.

TABLE 10

The effect of number of cycles on the resistivities and growth rates of platinum thin films

| Number of cycles | Resistivity (µΩcm) | Growth rate (Å/cycle) | Thickness (nm) |
| --- | --- | --- | --- |
| 1500 | 13.9 | 0.35 | 52 |
| 2250 | 12.4 | 0.39 | 78 |
| 3000 | 11.5 | 0.35 | 106 |

Although the foregoing invention has been described in terms of certain preferred embodiments, other embodiments will be apparent to those of ordinary skill in the art. Moreover, although illustrated in connection with particular process flows and structures, the skilled artisan will appreciate variations of such schemes for which the methods disclosed herein will have utility. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A process for producing an electrically conductive noble metal thin film on a substrate in a reactor by atomic layer deposition, comprising:
    placing a substrate in a reaction chamber within the reactor;
    providing a vaporized noble metal precursor pulse into the reaction chamber to form no more than about a single molecular layer of the precursor on the substrate;
    removing excess vaporized noble metal precursor from the reaction chamber;
    providing a second reactant gas pulse comprising oxygen to the reaction chamber such that the oxygen reacts with the precursor on the substrate;
    removing excess second reactant gas and any reaction by-products from the reaction chamber; and
    repeating until a thin film of a desired thickness is obtained.

2. The process of claim 1, wherein the second reactant gas comprises free oxygen.

3. The process of claim 2, wherein the free oxygen is molecular oxygen.

4. The process of claim 3, wherein the noble metal is selected from the group consisting of ruthenium, rhodium, palladium, silver, rhenium, osmium, iridium, platinum and gold.

5. The process of claim 3, wherein the noble metal precursor is selected from the group consisting of a metallocene compound and a beta-diketonate compound of the noble metal.

6. The process of claim 5, wherein the metallocene is selected from the group consisting of bis(cyclopentadienyl)-ruthenium, a derivative of bis(cyclopentadienyl)-ruthenium, (trimethyl)methylcyclopentadienylplatinum and a derivative of (trimethyl)methylcyclopentadienylplatinum.

7. The process of claim 5, wherein the beta-diketonate compound of the metal is selected from the group consisting of tris(2,2,6,6-tetramethyl-3,5-heptanedionato)ruthenium (III), a derivative of tris(2,2,6,6-tetramethyl-3,5-heptanedionato)ruthenium(III), bis(2,2,6,6,-tetramethyl-3,5-heptanedionato)ruthenium(II) and a derivative of bis(2,2,6, 6,-tetramethyl-3,5-heptanedionato)ruthenium(II).

8. The process of claim 3, wherein the second reactant gas is provided by pulsing oxygen into the reaction chamber.

9. The process of claim 3, wherein the second gas reactant is provided by pulsing a mixture of oxygen and inert gas into the reaction chamber.

10. The process of claim 3, wherein the second reactant gas is provided by the catalytic decomposition of an oxygen-containing chemical inside the reactor.

11. The process of claim 10, wherein the oxygen-containing chemical is $H_2O_2$ or an organic peroxide.

12. The process of claim 11, wherein the catalytic decomposition is carried out using a catalyst selected from the group consisting of palladium and platinum.

13. The process of claim 3, wherein the second reactant gas is provided by forming oxygen inside the reactor by decomposing $N_2O$.

14. The process of claim 3, wherein a growth initiating layer is provided on the substrate surface prior to depositing the noble metal thin film.

15. The process of claim 14, wherein the growth initiating layer comprises hydroxyl groups.

16. The process of claim 15, wherein the growth initiating layer is an $Al_2O_3$ thin film.

17. The process of claim 15, wherein the growth initiating layer is a $TiO_2$ thin film.

18. The process of claim 14, wherein the growth initiating layer has a thickness of between 10 Å and 20 Å.

19. The process of claim 14, wherein the growth initiating layer is produced by feeding $H_2O_2$ into the reaction chamber after placing the substrate in the reaction chamber and prior to providing the vaporized noble metal precursor pulse.

20. The process of claim 3, wherein the noble metal thin film comprises a plurality of metals selected from the group consisting of ruthenium, rhodium, palladium, silver, rhenium, osmium, iridium, platinum and gold.

21. The process of claim 20, wherein the noble metal thin film comprises ruthenium and platinum.

22. The process of claim 21, wherein the noble metal thin film comprises a first portion, adjacent to the substrate, consisting essentially of ruthenium, and a second portion, over the first portion, the second portion consisting essentially of platinum.

23. A process for producing a noble metal thin film on a substrate comprising:
    placing a substrate in a reaction chamber;
    pulsing a vaporized noble metal precursor into the reaction chamber to form an adsorbed layer of the noble metal precursor on the substrate;
    removing excess vaporized noble metal precursor;
    converting the adsorbed noble metal precursor layer to a noble metal layer by contacting the substrate with a gas containing oxygen;
    removing excess oxygen-containing gas and any reaction by-products; and
    repeating until a thin film of the desired thickness is formed.

24. The process of claim 23, wherein the oxygen is free oxygen.

25. The process of claim 24, wherein the oxygen is molecular oxygen.

26. A process for producing a capacitor in an integrated circuit, comprising:
    depositing a first insulating layer on a silicon substrate having a doped region;
    forming a conductive material contacting the substrate through the insulating layer;
    depositing a barrier layer over an exposed surface of the conductive material;
    depositing a first electrode layer comprising a noble metal on the barrier layer by an atomic layer deposition process;
    depositing a second insulating layer on the first electrode layer; and
    depositing a second electrode layer comprising a noble metal on the second insulator by an atomic layer deposition process.

27. The process of claim 26, wherein the atomic layer deposition processes comprise alternately reacting the substrate surface with a vaporized noble metal precursor and a gas comprising oxygen.

28. The process of claim 27, wherein the oxygen is free oxygen.

29. The process of claim 28, wherein the oxygen is molecular oxygen.

30. The process of claim 26, wherein the barrier layer comprises a metal nitride layer deposited by atomic layer deposition on the exposed surface of the conductive material.

31. The process of claim 30, wherein the barrier layer comprises tantalum silicon nitride.

32. The process of claim 26, wherein the second insulating layer comprises a layer having a high die electric constant that is deposited by atomic layer deposition.

33. The process of claim 32, wherein the second insulating layer comprises a layer selected from the group consisting of barium-strontium titanate and tantalum oxide.

34. A method of producing an ultra-high density magnetic recording device comprising:
    forming a first ferromagnetic recording layer on a substrate;
    forming by an atomic layer deposition process a non-magnetic layer consisting essentially of a noble metal on the first ferromagnetic recording layer; and
    forming a second ferromagnetic recording layer on the non-magnetic layer.

35. The method of claim 34, wherein the atomic layer deposition process comprises alternately reacting the substrate surface with a vaporized noble metal precursor and oxygen.

36. The method of claim 35, wherein the thickness of the non-magnetic layer is between about 1 nm and 100 nm.

* * * * *

UNITED STATES PATENT AND TRADEMARK OFFICE
CERTIFICATE OF CORRECTION

PATENT NO. : 6,824,816 B2
DATED : November 30, 2004
INVENTOR(S) : Aaltonen et al.

It is certified that error appears in the above-identified patent and that said Letters Patent is hereby corrected as shown below:

Title page,
Item [56], References Cited, OTHER PUBLICATIONS,
"M. Ritala and M. Leskela," reference, before "Chapter" please replace "." with -- , --; and after "103" please replace "," with -- . --.

Drawings,
Sheet 1 of 8, above "Temperature of $RuCp_2$(°C)" please replace "85" with -- 65 --.

Column 7,
Line 26, after "Seconds" please replace "," with -- . --.

Column 12,
Line 67, please replace "F-120$^{nm}$" with -- F-120$^{TM}$ --.

Column 13,
Line 3, after "inside" please insert -- the --.

Column 14,
Line 3, please replace "300" with -- 300°C --.
Line 24, please replace "<0.2." with -- <0.2 --.

Column 15,
Line 55, please replace "A/cycle" with -- Å/cycle --.

Column 18,
Line 41, please replace "die electric" with -- dielectric --.

Signed and Sealed this

First Day of November, 2005

JON W. DUDAS
*Director of the United States Patent and Trademark Office*